(12) United States Patent
Onoda et al.

(10) Patent No.: US 6,221,540 B1
(45) Date of Patent: Apr. 24, 2001

(54) PHOTOMASK AND PROJECTION EXPOSURE APPARATUS

(75) Inventors: Hiroshi Onoda, Yokohama; Nobutaka Magome, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/527,036

(22) Filed: Mar. 16, 2000

Related U.S. Application Data

(60) Continuation of application No. 08/960,211, filed on Oct. 29, 1997, now abandoned, which is a division of application No. 08/361,700, filed on Dec. 22, 1994, now abandoned, which is a continuation of application No. 07/965,775, filed on Oct. 23, 1992, now abandoned.

(30) Foreign Application Priority Data

Oct. 30, 1991 (JP) ..................................... 3-313635

(51) Int. Cl.⁷ ................................ G03F 9/00; G01B 11/00
(52) U.S. Cl. .................................. 430/5; 430/22; 356/401
(58) Field of Search ......................... 430/5, 22; 356/401, 356/399, 400; 355/53

(56) References Cited

U.S. PATENT DOCUMENTS

| | | | |
|---|---|---|---|
| 4,629,313 | 12/1986 | Tanimoto | 355/53 |
| 4,631,416 | * 12/1986 | Trutne, Jr. | |
| 4,710,029 | 12/1987 | Katoh | 356/401 |
| 4,853,745 | 8/1989 | Kamiya et al. | 355/43 |
| 4,865,455 | * 9/1989 | Kono et al. | 356/400 |
| 4,880,308 | * 11/1989 | Shirasu | 356/401 |
| 4,890,309 | * 12/1989 | Smith et al. | 430/5 |
| 4,993,837 | * 2/1991 | Oshida et al. | 236/401 |
| 5,212,028 | * 5/1993 | Fujino | 430/22 |

FOREIGN PATENT DOCUMENTS

| | | |
|---|---|---|
| 62-50811 | 4/1982 | (JP) . |
| 4-165352 | 6/1992 | (JP) . |

* cited by examiner

Primary Examiner—S. Rosasco
(74) Attorney, Agent, or Firm—Vorys, Sater, Seymour and Pease LLP

(57) ABSTRACT

A projection exposure apparatus includes a mark detection system adapted to accommodate a photomask having a phase shift type fiducial mark. The mark detection system may include, for example, a photoelectric detector, a light receiving optical system for guiding light from the fiducial mark to the photoelectric detector, and an adjustable stop member for variably setting at least one of an aperture diameter and an aperture position of the stop member.

25 Claims, 12 Drawing Sheets

FIG. 10A
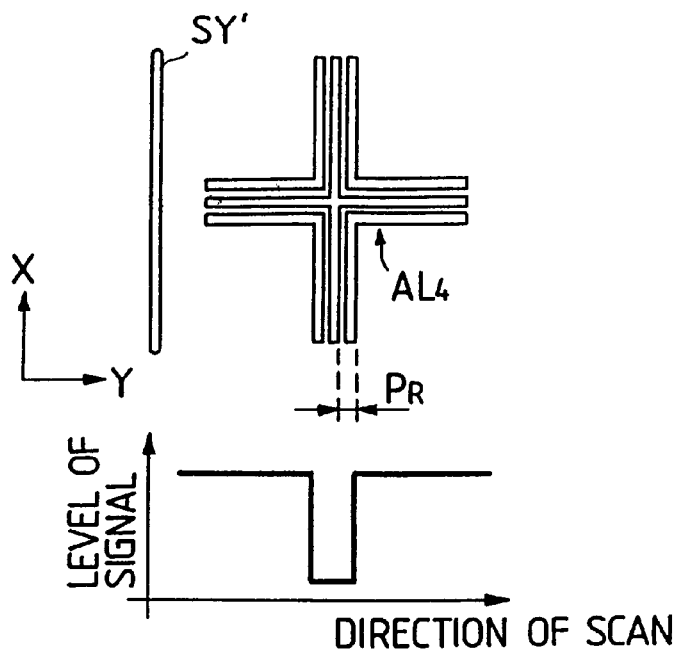
FIG. 10B
FIG. 11A
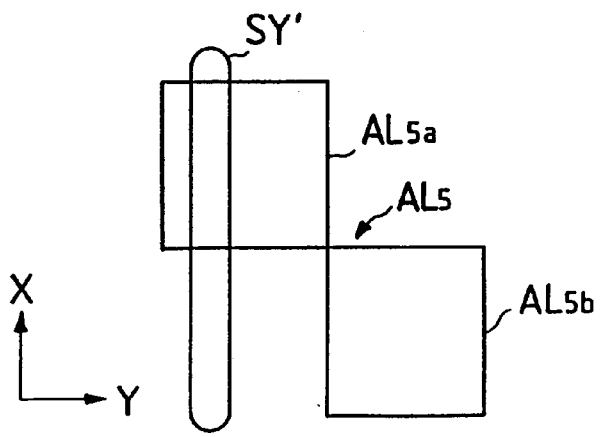
FIG. 11B
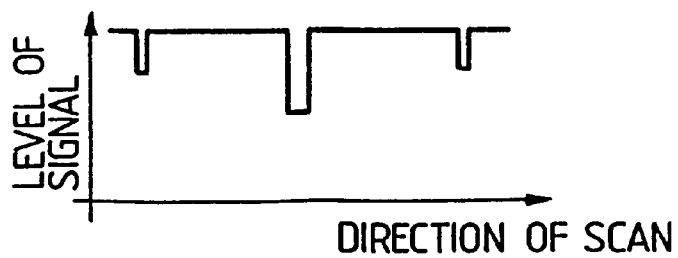

PHOTOMASK AND PROJECTION EXPOSURE APPARATUS

CROSS-REFERENCE TO RELATED APPLICATIONS

This application is a continuation of application Ser. No. 08/960,211 filed Oct. 29, 1997, which is a division of application Ser. No. 08/361,700 filed Dec. 22, 1994, which is a continuation of application Ser. No. 07/965,775 filed Oct. 23, 1992 (all now abandoned).

BACKGROUND OF THE INVENTION

1. Field of the Invention

The present invention relates to a photomask and a projection exposure apparatus used for the lithographic processes in the fabrication of semiconductor devices and liquid crystal devices.

2. Related Background Art

For a projection exposure apparatus (a stepper, for example), it has hitherto been practiced that the image of circuit patterns formed on a photomask (a reticle) is projected to be imaged on a photosensitive substrate (a semiconductor wafer or a glass plate with photoresist coated on the surface thereof) through a projection optical system. The reticle used for an apparatus of the kind is such that a shielding member (chrome or other metallic film) is provided to adhere to a substrate (quartz or other glass plate) which is transparent with respect to the illuminating light for exposure, and the circuit patterns formed by the light transmitting portion (the bare surface portion of the substrate) and the shielding portion are transferred onto the photosensitive substrate.

FIG. 20 is a view schematically showing the structure of a conventional projection exposure apparatus. FIG. 21 is a view showing the specific structure of a reticle shown in FIG. 20. In FIG. 20, the illuminating light for exposure (i line, excimer laser, or the like) IL emitted from an illumination system (not shown) is reflected by a dichroic mirror DCM to illuminate a reticle R stacked on a reticle stage RS with substantially even illuminance. The illuminating light IL transmitted through the pattern area PA of the reticle R enters the projection optical system PL which is telecentric on both sides. A projection optical system PL projects the image of circuit patterns to be imaged on the wafer.

As shown in FIG. 21, there are formed in the reticle R, four alignment marks $RX_1$, $RX_2$, $RY_1$, and $RY_2$ in the shielding zone (chrome layer) LSB having a specific width surrounding the pattern area PA. The four alignment marks are all transparent windows or linear type or cross type marks formed in a transparent window. Further, on the peripheral part of the reticle R, two reticle marks (cross type marks in FIG. 21) $RM_1$ and $RM_2$ are oppositely arranged. In this respect, any one of the marks on the reticle R is formed in the same process for the circuit patterns to be formed.

Two sets of reticle alignment systems $RA_1$ and $RA_2$ shown in FIG. 20 are as disclosed in U.S. Pat. No. 4,710,029, for example, provided to detect the reticle marks $RM_1$ and $RM_2$ by the application of a synchronous wave detection method. The reticle alignment systems $RA_1$ and $RA_2$ are used for positioning the reticle R with respect to the optical axis AX of the projection optical system PL by detecting the reticle marks $RM_1$ and $RM_2$ through mirrors $MR_1$ and $MR_2$.

Also, four sets of alignment sensors $AS_{X1}$, $AS_{X2}$, $AS_{Y1}$, and $AS_{Y2}$ all irradiate illuminating light of a wavelength range different from that of the exposure light IL onto the alignment marks on the reticle R through the dichroic mirror DCM and further irradiate the alignment marks formed on the peripheral part of the shot area on the wafer through the reticle R (transparent window) and the projection optical system PL. Moreover, the sensors detect the rays of light emitted from both marks photoelectrically thereby to detect the amount of the relative misregisteration between the reticle and the shot area. The sensors are arranged for each of the four alignment marks (transparent windows) $RX_1$, $RX_2$, $RY_1$, and $RY_2$. Applications have been filed as Ser. No. 687,944 (Apr. 19, 1991) and Ser. No. 888,828 (May 27, 1992) for the alignment sensors such as described above.

As shown in FIG. 22A, when a spot light SP and an alignment mark $AL_8$ on the reticle are scanned relatively in the direction Y, it is possible to obtain from a photoelectric detector a photoelectric signal as shown in FIG. 22B if the light transmitted through the reticle is received by the photoelectric detector. In accordance therewith, the mark position can be detected. Therefore, from each of the positions of plural alignment marks, the shifting amounts are calculated both in the directions X and Y as well as in the rotational direction of the reticle. Thus, a desirably accurate positioning of the reticle is possible by minutely adjusting the reticle stage so that the aforesaid shifting amounts will become zero.

In recent years, there has been proposed the use of a phase shift reticle provided with a phase shifter (dielectric thin film or the like) which can shift the phase of the light transmitted through a specific portion in the transmittable portions of a circuit pattern by π (rad) with respect to the light transmitted through the other transmittable portion thereof, instead of the reticle formed only by a light shielding member (metallic film). (Hereinafter, this latter reticle is referred to as an ordinary reticle). If the phase shift reticle is used, it becomes possible to perform a pattern exposure with a high resolution and great focal depth as compared with the ordinary reticle.

As regards the phase shift reticle, there have been proposed various methods, but the typical ones are of a spatial frequency modulation type, shifter light shielding type, and half tone type. For the spatial frequency modulation type phase shift reticle, there is a disclosure in Japanese Patent Publication 62-50811, for example, wherein a phase shifter is arranged to adhere to either one of the transmittable portions having therebetween light shielding patterns which are arranged at constant pitches. Also, for the shifter light shielding type phase shift reticle, there is a disclosure in Japanese Patent Laid-Open Application 4-165352, for example, wherein the structure is arranged only with the phase shift pattern having its width narrower than the resolution limit of a projection optical system to be employed. Further, for the half tone type phase shift reticle, there is an application filed as Ser. No. 780,249 (Oct. 22, 1991), for example, wherein the structure is arranged only with a semitransparent pattern for which the phase of transmitted light is shifted only by π (rad) and its transmittivity is defined to be approximately 15%.

In the phase shift reticles, particularly in the shifter light shielding type and half tone type, if the alignment marks are formed in the same process as the formation of the circuit patterns, a problem is encountered in that it becomes impossible to detect alignment marks in the conventional mark detection system. In other words, an alignment mark APL shown in FIG. 23A is formed only with the phase shifter in the shifter light shielding type while in the half tone type, it is formed only with the semitransparent member. Therefore, when the spot light SP and the alignment mark APL are relatively scanned, a photo-electric signal such as shown in FIG. 23B is obtained from the photoelectric detector. This means that the amount of the transmitted light is lowered only at the edge which is extended in the direction X of the alignment mark APL, and that even if the spot light SP is superposed on the mark APL, the amount of the transmitted light obtainable is still equal to the amount obtainable from the portion other than the mark APL.

As a result, when a phase shift reticle is employed, it is impossible to detect the mark position on the reticle accurately by use of the conventional projection exposure apparatus. There is thus a problem that the accuracy of the reticle alignment, the alignment between the reticle and wafer, the base line measurement or the like is lowered. In order to prevent this, it is necessary to form reticle marks with chrome and the like in a process other than the circuit pattern formation process or to provide a measurement instrument dedicated for the purpose. In either case, there is encountered a problem that the manufacturing cost will be increased.

SUMMARY OF THE INVENTION

The present invention is designed with a view to solving the above-mentioned problems. It is an object of the invention to provide a photomask having alignment marks capable of being detected in the same way as a light shielding member without increasing the manufacturing cost, time (processes), etc. even if the marks are formed with a transparent member (phase shifter or the like) or a semitransparent member, and to provide a projection exposure apparatus capable of detecting the marks concerned even if the alignment marks are formed with a transparent member or semitransparent member.

In order to achieve the foregoing, there is provided according to the present invention a fiducial mark (alignment mark $AL_2$) comprising a first transmittable portion (the bare surface portion of a substrate) which is substantially transparent with respect to an illuminating light (IL) of a given wavelength, and a second transmittable portion (phase shifter or a semitransparent member) providing a phase difference of substantially $(2n+1)\pi$ (n: an integer) with respect to the luminous flux which has passed the first transmittable portion. The first transmittable portion or the aforesaid second transmittable portion is formed with a width (t) which is narrower than that of the detecting resolution of the mark detection systems (10 to 12, FM, 3, 2, and 20).

Also, according to the present invention, there are provided diffraction grating type fiducial marks (alignment marks $AL_1$, $AL_3$, and $AL_4$) with the first transmittable portion and the second portion being arranged alternately, and then the first transmittable portion and the foregoing second transmittable portion are arranged at pitches where the rays of light (primary diffraction light, for example) emitted from the aforesaid fiducial marks are caused to be diffracted to the outside of the incident pupil of the mark detection system. Particularly, given the aperture number the mark detection system as NA and the wavelength of the illuminating light (ML) irradiated onto the fiducial marks as $\lambda$, the pitch $P_R$ of the fiducial marks is arranged to satisfy the relation $P_R < \lambda/NA$.

Further, according to the present invention, in a projection exposure apparatus provided with an illumination system (1, 3, DCM) for irradiating a first illuminating light (IL) onto the patterns formed on a mask (R); a projection optical system (PL) for projecting the image of mask patterns to be imaged on a substrate (W); and a mark detection system (10–12, FM, 3, 2, 20, or 10–12, FM, $MR_1$, 31–33) for irradiating a second illuminating light (ML) onto fiducial marks (alignment marks $AL_1$ to $AL_7$) formed on the mask to receive the rays of light emitted from the foregoing marks, the aforesaid mark detection system comprises a light receiving optical system (3, or 31 and 32) for guiding the rays of light emitted from the fiducial marks to a photoelectric detector (20 or 33); a diaphragm member (18 or 30) capable of shielding selectively the rays of light from the fiducial marks, which is arranged on the Fourier transform surface (Ep') or in the vicinity thereof with respect to the fiducial marks in the light receiving optical system.

Also, in a projection exposure apparatus according to the present invention, there are further provided inputting means (17) to input information regarding the fiducial mark formation conditions or the diaphragm member setup conditions, and adjusting means (15 and 19) to change the aperture diameter of the diaphragm member and/or the aperture positions in accordance with the information thus inputted. Furthermore, for a projection exposure apparatus according to the present invention, there are provided a substrate stage (WS) which is shiftable while holding a substrate, and a pattern plate (FM) arranged on the substrate stage, and also the mark detection system includes a light source (LS) to emit a second illuminating light having substantially the same wavelength range as the first illuminating light, and an illumination optical system (10 to 12) to irradiate the second illuminating light onto the pattern plate while the photoelectric detector is arranged to receive the rays of light emitted from the pattern plate and transmitted through the projection optical system and the fiducial marks through the light receiving optical system.

As described above, according to the present invention, the mark detection is performed by utilizing the scattering rays of light or diffracted rays of light emitted from the edge between the first transmittable portion (bare surface portion of the substrate) constituting the fiducial marks and the second transmittable portion (phase shifter or semitransparent member). Consequently, even if the formation is made only with the transparent member or semitransparent member, it is possible to obtain a photomask which is provided with the alignment marks capable of being detected the same as the light shielding member without increasing the manufacturing cost, time (processes), and the like.

Further, according to the present invention, there are provided in the mark detection system, the light receiving optical system to guide the rays of light emitted from the fiducial marks to the photoelectric detector, and the diaphragm member capable of shielding selectively the rays of light from the fiducial marks, which is arranged on the Fourier transform surface or in the vicinity thereof with respect to the fiducial marks in the light receiving system. As a result, it becomes possible to change the aperture diameter of the diaphragm member and/or the aperture positions for each of the masks used for the projection exposure apparatus, that is, in accordance with the formation conditions for each of the fiducial marks. Consequently, even for the phase shift mask, particularly the mask of a shifter light shielding type or half tone type, having the marks formed only with a phase shifter or semitransparent member provided in the same process as for the formation of the circuit patterns, it is possible to detect the foregoing mark positions accurately. Also, according to the present invention, only the diaphragm member is provided for the mark detection system. There is a significant advantage in that it becomes possible to perform such a mark detection even with a projection exposure apparatus currently in use in the manufacturing line by arranging a simple modification therefor.

BRIEF DESCRIPTION OF THE DRAWINGS

FIGS. 10A and 10B are views showing another structure of a preferable alignment mark for the projection exposure apparatus shown in FIG. 1, and a photoelectric signal to be obtained when the foregoing mark is used.

FIGS. 11A and 11B are views showing another structure of a preferable alignment mark for the projection exposure apparatus shown in FIG. 1, and a photoelectric signal to be obtained when the foregoing mark is used.

DETAILED DESCRIPTION OF THE PREFERRED EMBODIMENTS

Figure 1:
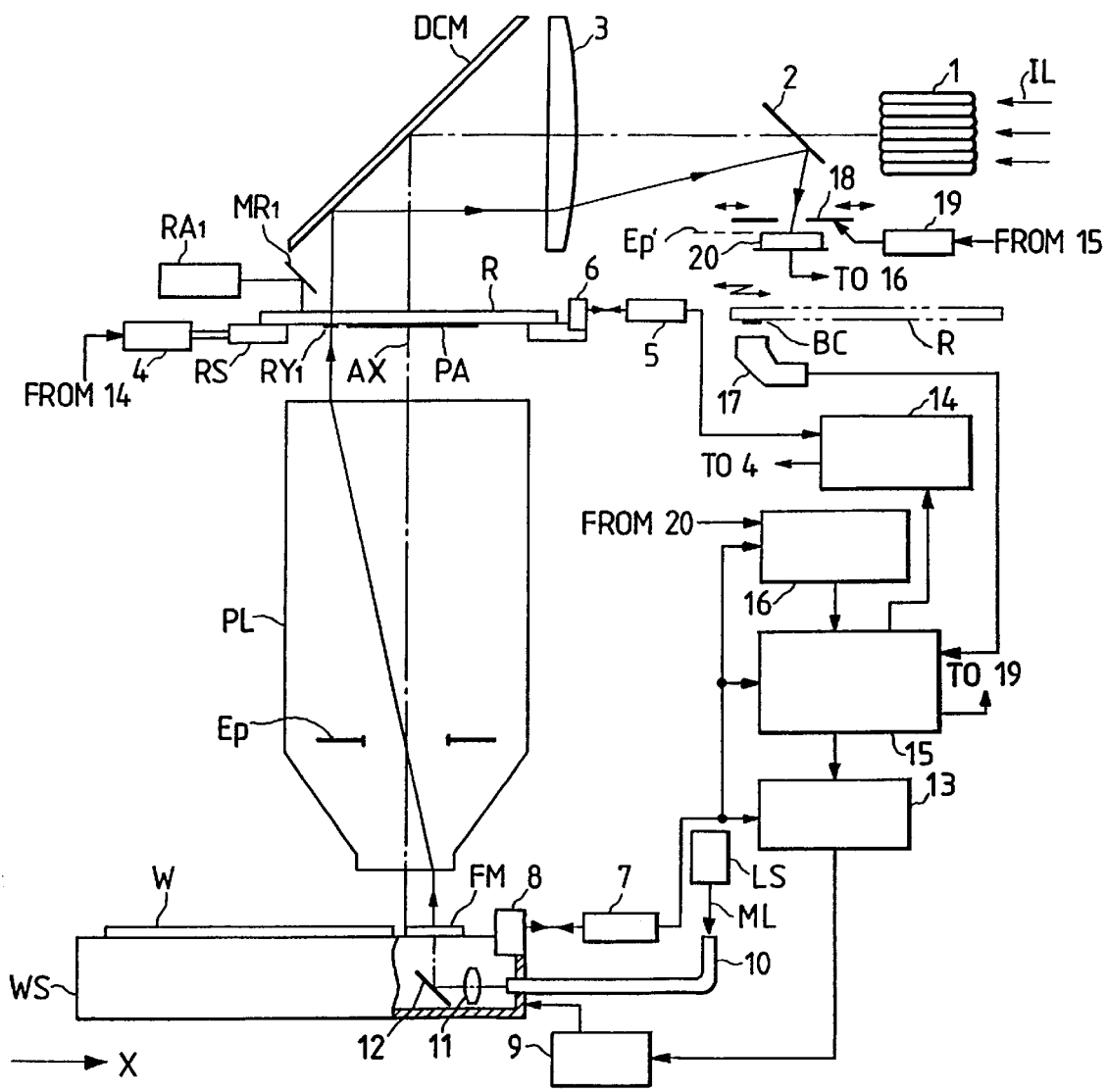
FIG. 1 is a view-schematically showing the structure of a projection exposure apparatus according to a first embodiment of the present invention.
Figure 21:
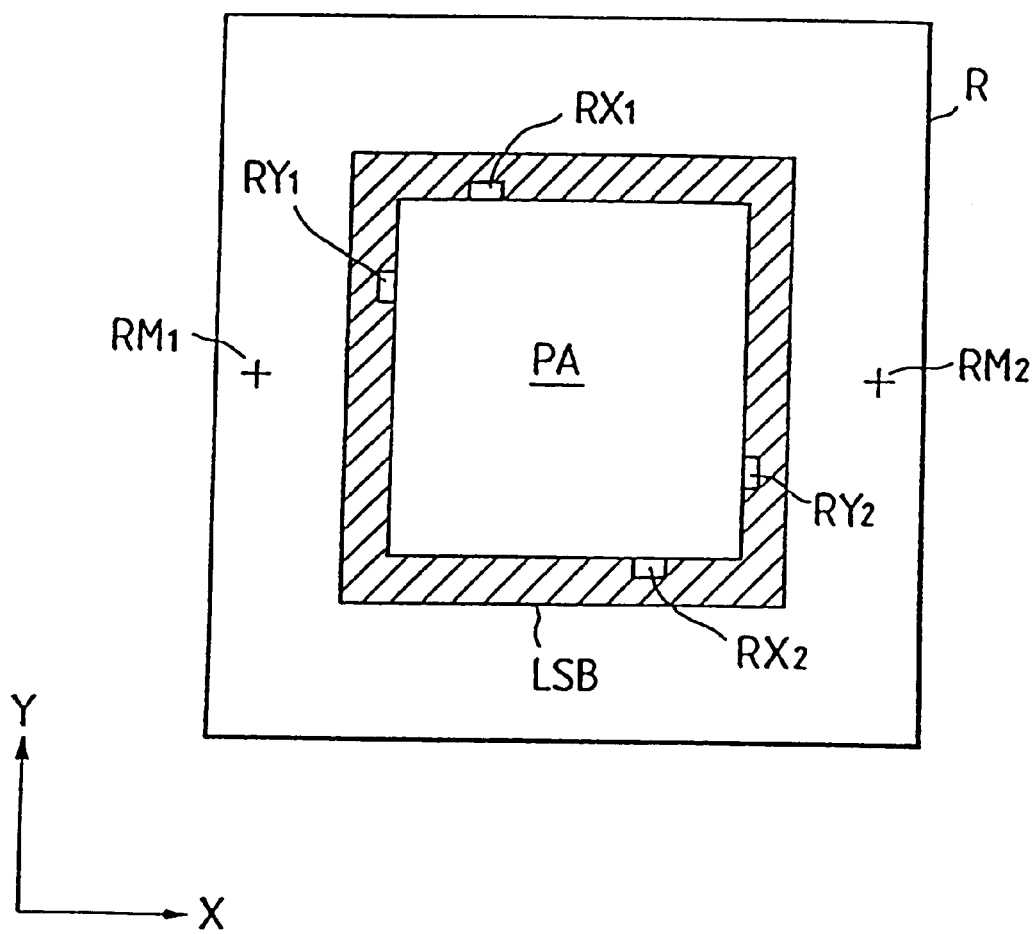
FIG. 21 is a view showing the specific structure of a reticle shown in FIG. 20.
Figure 22A:
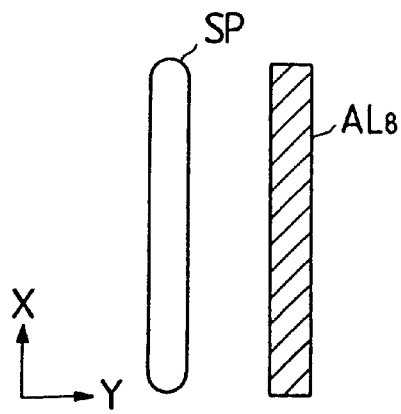
FIGS. 22A and 22B are views showing an alignment mark formed by a light shielding member and a photoelectric signal to be obtained when the foregoing mark is scanned by the use of a spot light.
Figure 22B:
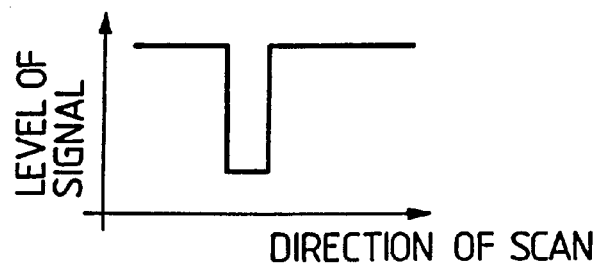
Figure 23A:
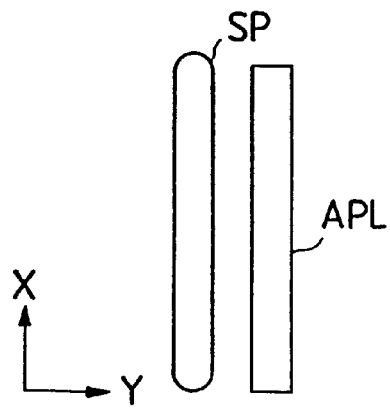
FIGS. 23A and 23B are views showing an alignment mark formed by a phase shifter and a photoelectric signal to be obtained when the foregoing mark is scanned by the use of a spot light.
Figure 23B:
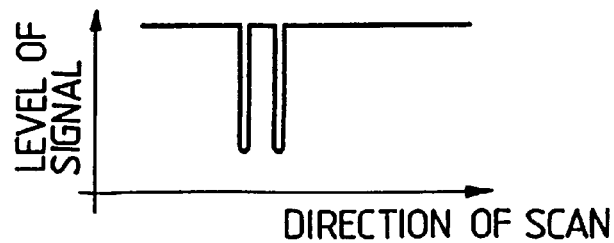

FIG. 1 is a view schematically showing the structure of a projection exposure apparatus according to a first embodiment of the present invention. In FIG. 1, the illuminating light for exposure IL emitted from a light source which is not shown enters a fly eye lens 1 as parallel rays of light and then irradiates a reticle R stacked on a reticle stage RS with a substantially even illuminance through a beam splitter 2, a condenser lens 3, and a dichroic mirror DCM. The reticle stage RS can be shifted two dimensionally within a plane orthogonal to the optical axis AX of an projection optical system PL and also can be rotated minutely by a driving system 4. At the end portion of the stage, a movable mirror 6 is mounted to reflect the laser beam from a laser interferometer 5. The two dimensional positions of the reticle stage RS are always detected by the laser interferometer 5 with a resolution of approximately 0.01 μm. In this respect, the structure of the reticle R is assumed to be the same as the one shown in FIG. 21.

Also, two sets of reticle alignment systems $RA_1$ and $RA_2$ (only $RA_1$ being shown in FIG. 1) are symmetrically arranged with respect to the optical axis AX to detect the cross type reticle marks $RM_1$ and $RM_2$ (FIG. 21) thereby to output the detecting signals to a main control system 15. The main control system 15 calculates the shifting amounts of the reticle R in the X and Y and rotational directions on the basis of the detecting signals. Thus, a stage controller 14 controls the driving system 4 using the positional information from the interferometer 5 so as to make the aforesaid shifting amounts substantially zero. Hence, the center of the reticle R and the optical axis AX are substantially matched. The structure of the reticle alignment system is disclosed in U.S. Pat. No. 4,710,029, for example.

The illuminating light IL passing through the pattern area PA of the reticle R enters the projection optical system PL which is telecentric on both sides and then the projection optical system PL projects the image of the circuit patterns to be imaged on a wafer W. The wafer W is stacked on a wafer stage WS which is two-dimensionally shiftable by means of the driving system 9 within a plane orthogonal to the optical axis AX of the projection optical system PL. At the end of the stage, a movable mirror 8 is provided to reflect the laser beam from a laser interferometer 7. The two-dimensional positions of the wafer stage WS are always detected by the interferometer 7 with a resolution of approximately 0.01 μm.

Figure 2:
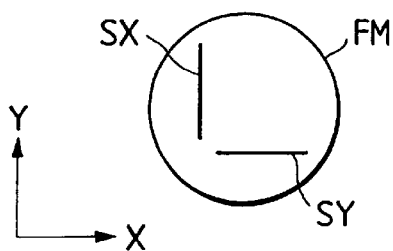
FIG. 2 is a view showing the specific structure of a fiducial member shown in FIG. 1.

Also, on the wafer stage WS, a fiducial member (quartz or other glass substrate) FM is provided. As shown in FIG. 2, on the surface of the fiducial member FM, two sets of light transmittable bar marks (slit marks) SX and SY are formed. A light source LS emits the illuminating light ML which has substantially the same wavelength range as the exposure light IL. The illuminating light ML illuminates the fiducial member FM from its lower face through an optical fiber (light guide) 10, a lens system 11, and a mirror 12. Light transmitted through the slit mark (SY, for example) on the fiducial member FM reaches the reticle R through the projection optical system PL and on the lower face (pattern surface) thereof, the image of the slit mark SY is imaged. Further, the illuminating light passing through the reticle R (alignment mark $RY_1$) is reflected by a beam splitter 2 through a dichroic mirror DCM and a condenser lens 3 to enter a photoelectric detector 20 through a variable aperture diaphragm 18 (stop member). The photoelectric detector (photo multiplier and the like) 20 outputs photoelectric signals to a photoelectric signal processing circuit 16 in accordance with the intensity of the incident light. The signal processing circuit 16 also receives phase information from the interferometer 7 to calculate the alignment mark positions (that is, the coordinate values on the orthogonal coordinate systems X and Y regulated by the interferometer 7) by the application of a given operational process.

Figure 4:
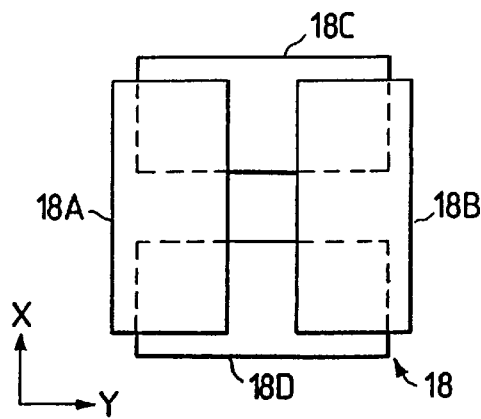
FIG. 4 is a view showing the specific structure of a variable aperture diaphragm shown in FIG. 1.

Here, as shown in FIG. 4, the variable aperture diaphragm 18 comprises four movable blades (dousers) 18A to 18D. Each of the blades is driven independently by the driving system 19. In this way, it is possible to arbitrarily change the aperture diameters, configurations, and positions of the variable aperture diaphragm 18. Also, the variable aperture diaphragm 18 is arranged extremely close to the light receiving plane of the photoelectric detector 20. The light receiving plane of the photoelectric detector 20 is arranged in the plane conjugate to the pupil surface (Fourier transform surface) Ep of the projection optical system PL, that is, the Fourier transform surface EP' to the pattern surface of the reticle R. It will be appreciated that, although a light source LS is provided separately from the light source for exposure in FIG. 1, it is possible to arrange the structure so that part of the exposure light IL is branched by providing a beam splitter in the exposure illumination system, thus being guided to the fiducial member FM by means of an optical fiber, mirror, or the like as disclosed in U.S. Pat. No. 4,853,745.

In a projection exposure apparatus of the above-mentioned structure (FIG. 1), it is anticipated that the formation conditions (materials, pitches, etc.) of the alignment marks vary depending on a reticle to be used. Particularly for a phase shift reticle of a shifter light shielding type or half tone type, this can lead to difficulty in detecting marks. Therefore, in the present embodiment, the aperture (diameter, etc.) of the variable aperture diaphragm 18 is made changeable using the driving system 19 to optimize the mark detection conditions for each of the reticles, thus making mark detections possible for any reticles. The driving system 19 is operated in accordance with operational instructions from the main control system 15. The conditions set for the aperture parameters are effectuated in accordance with information obtainable by the use of a bar code reader 17 which reads the bar code pattern BC on the reticle R. In this respect, it may be possible for an operator to input the abovementioned information from a key board into the main control system 15.

It is possible to register the setup conditions mentioned above in the bar code pattern BC on the reticle R or to allow the main control system 15 to store (input) in advance the reticle names and the corresponding set conditions so that the main control system can select the optimal setup condition by comparing a reticle name registered in the bar code pattern BC with the stored contents as above. Also, instead of the above-mentioned setup conditions, the mark forma-tion conditions (such as materials, line widths, and pitches) on the reticles may be registered in the bar code pattern BC or stored in the main control system 15. In this case, the main control system 15 determines the setup conditions for the variable aperture diaphragm 18 in accordance with the above-mentioned formation conditions.

The main control system 15 performs the overall control on the entire system in addition to the operation to change the aperture parameters for the variable aperture diaphragm 18 on the basis of the mark R of a reticle. The stage controller 13 performs servo controls of the driving system 9 using the positional information from the interferometer 7 in accordance with the positioning target value (coordinate values) from the main control system 15.

Figure 3:
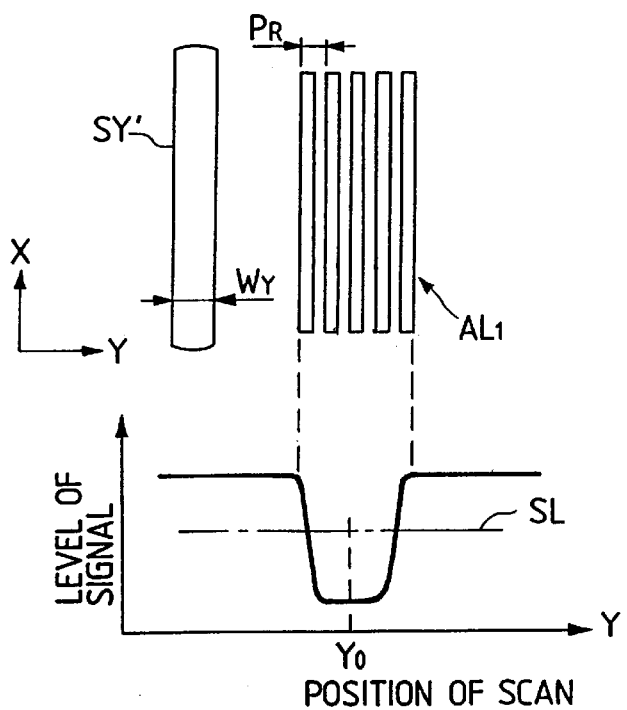
FIG. 3 is a view showing the structure of an alignment mark to be used for the first embodiment and the photoelectric signal to be obtained when the foregoing mark is used.

Next, the description will be made of the operation of an apparatus according to the present embodiment, particularly of the operation of the reticle alignment in brief. It is assumed in the present embodiment that a phase shift reticle of a shifter light shielding type is used, and for the alignment mark, a diffraction grating mark is formed with the phase shifter (a second transmittable portion) and the light transmittable portion (a first transmittable portion) which are arranged alternately. In FIG. 3, an example of the diffraction grating mark is represented. The diffraction grating mark $AL_1$ (corresponding to the mark $RY_1$ in FIG. 1, for example) is such that a linear phase shifter which extends in the direction X is arranged in the direction Y at pitches $P_R$. Also, the phase shifter is formed in a film thickness so that the phase of its transmitting light is shifted substantially by $(2n+1)\pi$ (rad) (n: an integer) with-respect to the transmitting light from the light transmittable portion. The Y direction width of the slit mark SY on the fiducial member FM and the pitch $P_R$ of the diffraction grating mark $AL_1$ are assumed to be defined as shown in FIG. 3 that the Y direction width $W_Y$ of the projection image SY' of the slit mark SY is slightly more than the pitch $P_R$.

In FIG. 1, when the reticle R is loaded on the reticle stage RS, the bar code reader 17 reads the bar code pattern BC to output information stored in the pattern BC to the main control system 15. The main control system 15 determines the setup conditions of the variable aperture diaphragm 18 to enable the mark position detections on the basis of the foregoing information, that is, the reticle mark formation conditions.

Here, in the present embodiment, the diffraction grating mark $AL_1$ in FIG. 3 is used as an alignment mark. As a result, there is almost no zeroth order light being emitted from the diffraction grating mark $AL_1$ when the slit mark SY of the projected image SY' and the diffraction grating mark $AL_1$ are relatively shifted in the direction Y as shown in FIG. 3. Therefore, if the diffraction light of the primary order or more, which is emitted from the diffraction grating mark $AL_1$, is shielded by the variable aperture diaphragm 18, a photoelectric signal such as shown in FIG. 3 is output from the photoelectric detector 20. In other words, even for the mark $AL_1$ composed of the phase shifter, it is possible to detect its position.

Figure 5:
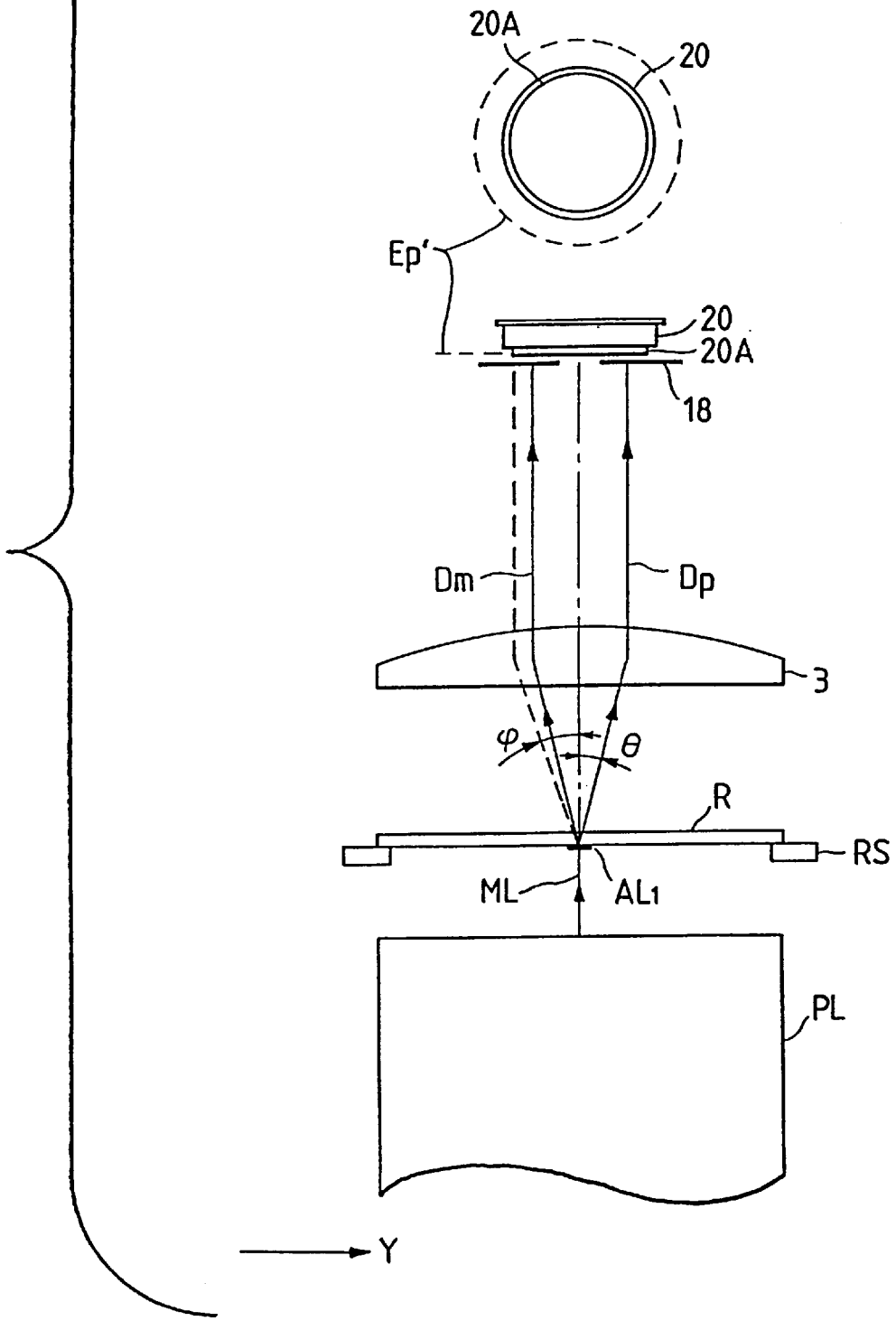
FIG. 5 is a view showing a specific structure of a mark detection system, particularly that of a light receiving optical system shown in FIG. 1.

Now, with reference to FIG. 5, the description will be made of a setup method for the variable aperture diaphragm 18 in detail. FIG. 5 is a view schematically showing the light passage from the projection optical system PL to the photoelectric detector 20. In FIG. 5, when the illuminating light ML (projected image SY') is irradiated onto the alignment mark $AL_1$, ± primary diffraction rays of light Dp and Dm are emitted from the mark $AL_1$. Given the wavelength of the illuminating light ML as $\lambda$, the diffraction angle $\theta$ of the primary light will become $\sin\theta = \lambda/P_R$.

The effective aperture number (numerical aperture) NA of the light receiving optical system (a condenser lens 3 in FIG. 5), which guides the rays of light emitted from the alignment mark $AL_1$ to the photoelectric detector 20, is uniquely defined by the aperture number of the light receiving optical system and the size of the light receiving area 20A of the photoelectric detector 20 in the conjugate plane Ep' of the pupil. Here, if no variable aperture diaphragm 18 is provided, the aperture number NA is expressed as NA=sin ø. Accordingly, since the relation NA>sin θ is satisfied, the ± primary diffraction rays of light Dp and Dm are allowed to enter the light receiving surface 20A. Although not shown in FIG. 5, a relay lens system, variable field diaphragm (reticle blind) and the like are provided between the fly eye lens 1 and condenser lens 3 in the projection exposure apparatus. Thus, the light receiving optical system is a synthesized system of the condenser lens 3, relay lens system and others.

According to the present embodiment, the ± primary diffraction rays of light Dp and Dm are not permitted to enter the light receiving surface 20A. In other words, the aperture diameter of the variable aperture diaphragm 18 is determined so as to satisfy the relation NA<sin θ. Consequently, as shown in FIG. 5, the ± primary diffraction rays of light Dp and Dm can be shielded by the variable aperture diaphragm 18 thereby to obtain a photoelectric signal as shown in FIG. 3 from the photoelectric detector 20.

The main control system 15 causes the driving system 19 to drive each of the movable blades of the variable aperture diaphragm 18 after having determined the setup conditions (aperture diameter) of the variable aperture diaphragm 18 as described above. Then, the wafer stage WS is minutely shifted in the direction Y to move the projected image of the slit mark SY and the alignment mark $AL_1$ ($RY_1$) relatively. At this juncture, the signal processing circuit 16 receives photoelectric signals from the photoelectric detector 20 as well as positional signals from the interferometer 7 to calculate the position (coordinate value $Y_0$) of the alignment mark $RY_1$ in the direction Y by a given operation, a waveform processing at a given slice level SL as shown in FIG. 3, for example. Thereafter, exactly in the same manner as above, each position of the remaining three alignment marks $RY_2$, $RX_1$, and $RX_2$ is obtained. Then, on the basis of these coordinate values, the amounts of shifts in X, Y, and rotational directions of the reticle R are calculated with respect to the orthogonal coordinate systems XY. After that, the reticle stage RS is minutely shifted to make each of the shifted amounts zero; hence terminating the reticle alignment.

As described above, in the present embodiment, the aperture diameter of the variable aperture diaphragm 18 is adjusted in accordance with the formation conditions (material, pitches, and the like) of the alignment marks on a reticle R. Therefore, even for a phase shift reticle of a shifter light shielding type or half tone type having alignment marks formed in the same process as the formation of the circuit patterns, it is possible to detect them accurately using these marks as they are. Here, in the present embodiment, while the description has been made of the phase shift reticle of a shifter light shielding type, it will suffice if the aperture diameter of the variable aperture diaphragm 18 is controlled so as to allow both zeroth light and primary diffraction light emitted from a light shielding diffraction grating mark to enter the photoelectric detector 20 together when an ordinary reticle is used, for example. Also, in the present embodiment, the description has been made of a reticle alignment, but as disclosed in U.S. Pat. No. 4,853,745, for example, it is effective in driving the variable aperture diaphragm 18 exactly the same as the above operation in a case where marks are detected on a reticle at the time of base line measurement.

Figure 6A:
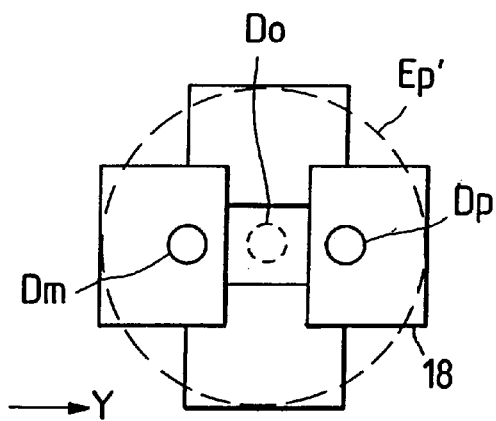
FIGS. 6A and 6B are views showing the light distribution in the vicinity of the variable aperture diaphragm shown in FIG. 5.
Figure 6B:
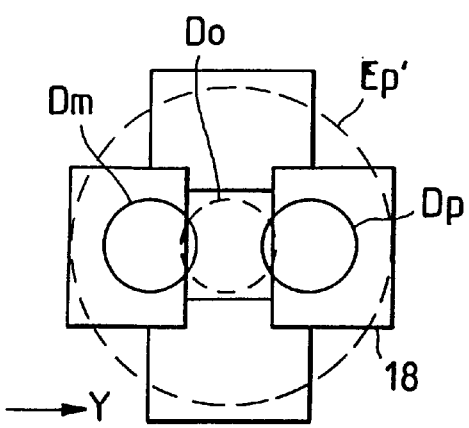

Although no reference has been made in the present embodiment to the coherence factor (a value) of the illumination system (LS, 10 to 12) which irradiates the illuminating light ML onto the fiducial member FM, it is preferable to set the a value at 0.1 to 0.4 approximately. Regarding this, the description will be made with reference to FIGS. 6A and 6B. FIGS. 6A and 6B illustrate the state of the variable aperture diaphragm 18 in FIG. 5 as viewed from the reticle side. FIG. 6A represents it when its a value is 0.2 while FIG. 6B, a value is 0.6.

Whereas the ± primary rays of light Dp and Dm and the zeroth order light (not emitted actually) $D_0$ are separated on the variable aperture diaphragm 18 (pupil conjugate surface Ep') in FIG. 6A, the ± primary rays of light Dp and Dm and the other light $D_0$ are partially overlapped in FIG. 6B. In other words, although depending on the alignment pitches, there is a possibility that the contrast between photoelectric signals is lowered if the a value -is great (0.5 or more, for example). This takes place even if the aperture diameter of the variable aperture diaphragm 18 is adjusted as in the above-mentioned embodiment because the ± primary diffraction rays of light Dp and Dm are partially mixed in the photoelectric detector 20. Therefore, it is preferable to set the σ value at 0.1 to 0.4 approximately, by interlocking it with the driving of the variable aperture diaphragm 18.

Figure 7:
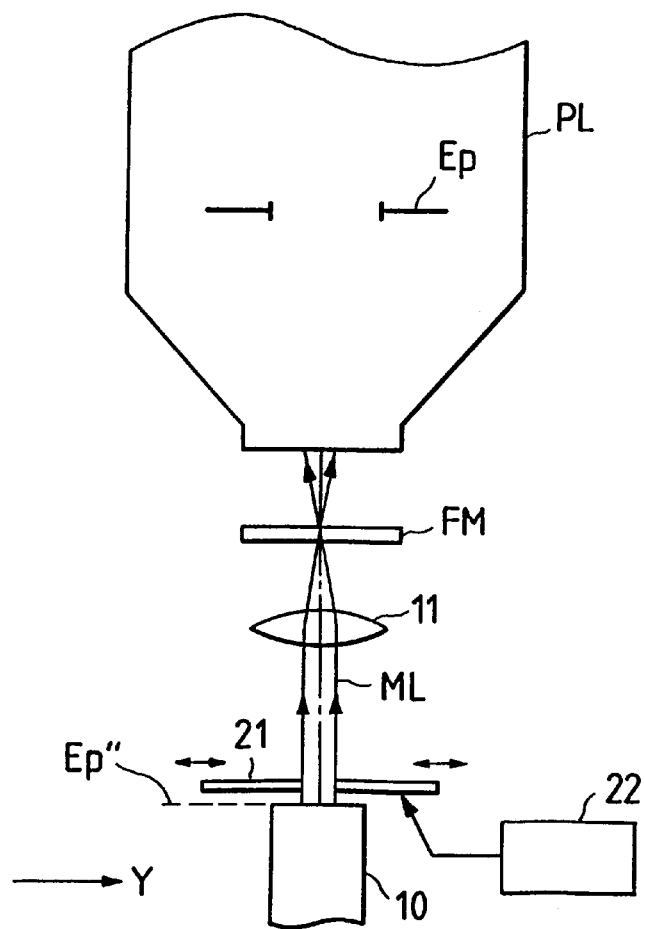
FIG. 7 is a view showing the structure of a σ variable mechanism of an illuminating system to irradiate an illuminating light onto a fiducial member.

FIG. 7 is a view schematically showing an example of the illumination system which is provided with a σ variation mechanism, in which the same reference marks are given to the same members shown in FIG. 1. In FIG. 7, the exit surface of an optical fiber 10 is arranged in the plane conjugate to the pupil surface Ep" of a projection optical system PL. Extremely close to this exit surface, a variable aperture diaphragm 21 is provided. The variable aperture diaphragm 21 has the same structure as the variable aperture diaphragm 18 (FIG. 4), for example. It is arranged to enable arbitrary adjustments of the aperture diameter by driving each of the movable blades independently using a driving system 22. Therefore, when the main control system 15 determines that the reticle is of a phase shift reticle in accordance with the related information contained in the bar code pattern BC, the control system causes the variable aperture diaphragm 21 to be driven to change the σ value by interlocking it with the driving of the variable-aperture diaphragm 18 (FIG. 1). In this case, taking even the pitches of the alignment mark into account, it is possible to) change σ values by driving the variable aperture diaphragm 21 only when the zeroth light and primary diffraction light are anticipated to overlap each other at the σ values before any change.

Instead of the variable aperture diaphragm systems (21 and 22) as a σ variation mechanism, it is possible to adopt a zoom lens system as the lens system 11, for example. Also, instead of changing the a values with the arrangement of the σ variation mechanism such as described above, it is possible to form the pitches of the alignment mark minute enough for σ values (fixed values) of the illumination system in advance so as not to allow the zeroth light and primary diffraction light to be overlapped in the pupil conjugate surface Ep'. Moreover, although the variable aperture diaphragms 18 and 21 are both structured with four movable blades, such a structure can be modified in any suitable manner. Also, the structure may be such that a plurality of diaphragms having aperture diameters and aperture positions different from each other are arranged on a turret board or a slider, and each of the plural diaphragms is exchangeably arranged in the vicinity of the light receiving surface of the photoelectric detector 20.

Now, with reference to FIGS. 8A and 8B to FIGS. 12A and 12B, alignment marks preferably used for the above-mentioned apparatus (FIG. 1) will be described. The alignment marks shown in FIGS. 8A and 8B to FIGS. 12A and 12B are formed each with a reticle (glass substrate) to which a phase shifter or semitransparent member is arranged to adhere in the same process as the formation of circuit patterns. Also, the phase of the transmitting light of the phase shifter or semitransparent member is assumed to be shifted only by $\pi$ (rad) with respect to the transmitting light of the light transmittable portion (bare surface portion of the substrate).

Figure 8A:
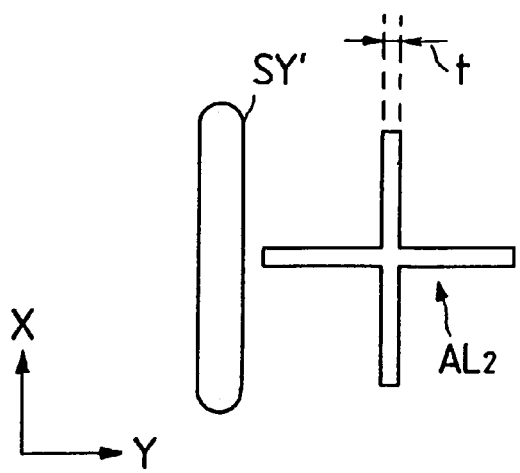
FIGS. 8A and 8B are views showing another structure of a preferable alignment mark for the projection exposure apparatus shown in FIG. 1, and a photoelectric signal to be obtained when the foregoing mark is used.

In FIG. 8A, a cross-type alignment mark $AL_2$ is defined to make its mark widths in the directions X and Y equal to each other and the mark width t narrower than the detection resolution of the mark detection system (comprising LS, 10 to 12, FM, PL, 3, 2, 18, and 20 in FIG. 1). In other words, the mark width t is defined to be narrower than the width of the projection image SY' of the slit mark in the direction Y, and it is particularly desirable to define it to be less than ½ of the width of the projection image SY'.

Figure 8B:
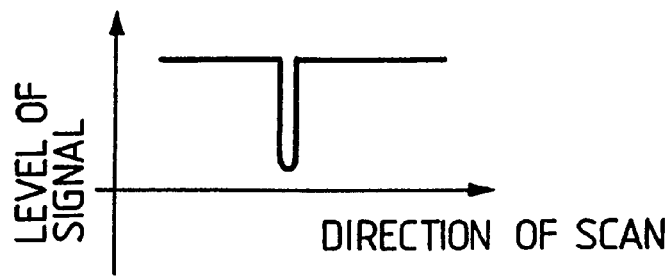

Now, in the apparatus shown in FIG. 1, when the alignment mark $AL_2$ and the projection image SY' are relatively scanned in the direction Y, there will be no zeroth order light being emitted from the mark $AL_2$. Also, the scattering rays of light emitted from the edge which is extended in the direction X are shielded by the variable aperture diaphragm 18, particularly by the movable blades 18A and 18B. Therefore, the resultant photoelectric signal output from the photoelectric detector 20 will be such as shown in FIG. 8B. Consequently, even when the alignment mark is formed with a phase shifter or a semitransparent member, the alignment mark position can be detected simply as in a case of an alignment mark being formed with a light shielding member.

Here, in FIG. 8A, the alignment mark is formed by arranging a cross-type phase shifter (or semitransparent member) to adhere to the reticle, but it is possible to reverse the phase shift portion (the second transmittable portion) and the glass portion (the first transmittable portion). In other words, the phase shifter (or the semitransparent member) is arranged to adhere to a given area and then the cross-type mark is patterned within this area to form the cross-type mark as the glass portion. The formation conditions in this case are exactly the same as the alignment mark $AL_2$ represented in FIG. 8A.

Figure 9A:
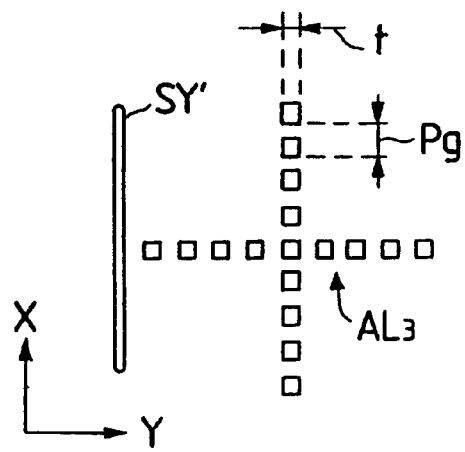
FIGS. 9A and 9B are views showing another structure of a preferable alignment mark for the projection exposure apparatus shown in FIG. 1, and a photoelectric signal to be obtained when the foregoing mark is used.
Figure 9B:
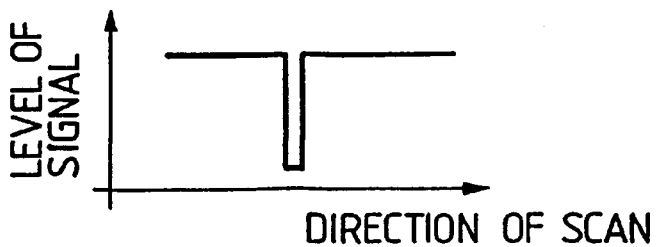

Also, as shown in FIG. 9A, an alignment mark $AL_3$ is diffraction grating mark with dot marks being arranged at pitches Pg each in the directions X and Y. Here, the mark width t in the X and Y directions can be of an arbitrary value, but it is desirable to define it to be substantially equal to or less than the width of the projection image SY'. In the apparatus shown in FIG. 1, when the alignment mark $AL_3$ and the projection image SY' are relatively scanned in the direction Y, there will be no zeroth order light being emitted from the mark $AL_3$ and the scattered rays of light emitted from the edge which is extended in the direction X and the diffraction light emitted from the edge which is extended in the direction Y are both shielded by the variable aperture diaphragm 18. Accordingly, the photoelectric signal output from the photoelectric detector 20 will be such as shown in FIG. 9B, thus making it possible to detect the alignment mark position with a desirable accuracy. Of course, it is possible to arrange the alignment mark by reversing the phase shift portion and the glass portion in the present embodiment, too.

Given the aperture number of the mark detection system (light receiving optical system) as NA, the wavelength of the illuminating light ML as $\lambda$ and the pitch $P_g$ of the alignment mark $AL_3$ as a value to satisfy the relation $P_g < \lambda/NA$, the primary diffraction light emitted from the mark $AL_3$ is not allowed to enter the photoelectric detector 20 (light receiving surface). In other words, it is possible to obtain a photoelectric signal such as shown in FIG. 9B even without the provision of the variable aperture diaphragm 18 and to enable the alignment mark positions to be detected accurately. Also, it is desirable to define the $\sigma$ value of the illumination system which irradiates the illuminating light onto the alignment mark $AL_3$ at 0.1 to 0.4 approximately. The reason for this is that if the $\sigma$ value is small, the coherence of the light passing through the phase shifter or semitransparent member and the light passing through only the glass substrate is enhanced. Accordingly, the contrast of the photoelectric signals becomes high, thus making it possible to enhance the detection accuracy. According to experiments, when the $\sigma$ value is set at less than 0.4, the contrast of the photoelectric signals is enhanced, and when the $\sigma$ values is further set at 0.2 to 0.3, it is possible to obtain the photoelectric signals of the highest contrast.

Also, as shown in FIG. 10A, an alignment $AL_4$ is of a cross-type diffraction grating mark with bar marks arranged at pitches $P_R$ each in the directions X and Y. The fundamental structure thereof is the same as the alignment mark $AL_1$ shown in FIG. 3. Here, in the above-mentioned embodiment, the diffraction light of more than the primary order emitted from the alignment mark $AL_1$ is shielded using the variable aperture diaphragm 18. Therefore, the pitch PR of the aforesaid mark $AL_1$ can be arbitrary. Now, if, on the contrary, the pitch $P_R$ of the alignment mark $AL_1$ or $AL_4$ is defined to satisfy the relation $P_R < \lambda/NA$, any diffraction light of more than primary order emitted from the mark $AL_4$ is not allowed to enter the photoelectric detector 20 (light receiving surface). In other words, even without the provision of the variable aperture diaphragm 18, it is possible to obtain a photoelectric signal such as shown in FIG. 10B. Thus, the positions of the alignment mark can be detected accurately.

In the above-mentioned description, the illuminating light is irradiated onto the alignment mark on the reticle to detect the light passing through the aforesaid mark photoelectrically. It is also possible to arrange the structure so that the rays of light reflected from the alignment mark can be detected photoelectrically for the purpose as a matter of course. However, in the case where the reflected rays of light from the alignment mark are received, there will be almost no zeroth order light being emitted from the aforesaid mark. The intensity of the positive reflection light from the portion other than the mark, that is the light transmittable portion (bare surface portion of the substrate), is also low. Therefore, if the primary rays of diffraction light (Dp and Dm) from the alignment marks ($AL_1$, $AL_3$ and $AL_4$) are shielded as in the above-mentioned embodiment, the contrast of the photoelectric signal becomes extremely low, thus making it impossible to detect the alignment mark positions accurately. In this case, therefore, the aperture diameter and aperture position of the variable aperture diaphragm 18 are adjusted so that among the rays of light emitted from the reticle, only the positive reflection light (zeroth order light) is shielded but not the primary diffraction light. Thus, it becomes possible to detect the alignment mark positions accurately even if a mark detection system is such as receiving the reflection light. In this case, however, it is necessary to define the pitch $P_R$ of the alignment mark $AL_1$ to satisfy the relation $P_R > \lambda/NA$.

Now, the description will be made of other alignment marks preferably used for the above-mentioned apparatus (FIG. 1). As shown in FIG. 11A, the alignment mark $AL_5$ is of a combination of two oblong patterns $AL_{5a}$ and $AL_{5b}$. In other words, the alignment mark $AL_5$ has one side of the oblong pattern $AL_{5a}$ and one side of the oblong pattern $AL_{5b}$ existing on a same straight line which extends in a direction (X direction) orthogonal to the scanning direction (Y direction) and then the oblong patterns $AL_{5a}$ and $AL_{5b}$ are arranged separately on the left and right sides with respect to the aforesaid straight line.

Therefore, when the alignment mark $LA_5$ and the projection image SY' are relatively scanned in the direction Y, the photoelectric signal output from the photoelectric detector 20 will become such as shown in FIG. 11B. As clear from FIG. 11B, the signal level is significantly lowered at the edge of the boundary portion between the oblong patterns $AL_{5a}$ and $AL_{5b}$ as compared with the edges at both ends of the alignment mark $AL_5$. As a result, it is possible to detect the alignment mark positions with A desirable accuracy by the use of the signal waveform in the vicinity of t he above-mentioned boundary portion.

Here, in FIG. 11A, the two oblong patterns $AL_{5a}$ and $AL_{5b}$ are arranged in point symmetry. Accordingly, even if the main rays of illuminating light are inclined in entering the alignment mark $AL_5$, for example, the effect attributable thereto can be offset between the edges of the boundary portions of the two oblong patterns $AL_{5a}$ and $AL_{5b}$, thereby to prevent the degradation of the mark position detection accuracy.

Figure 12A:
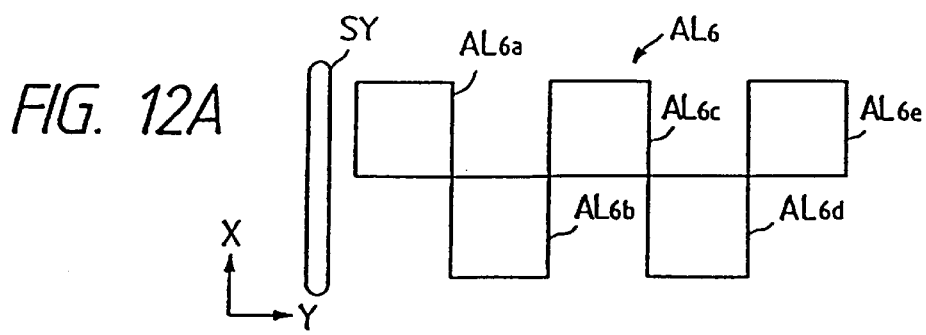
FIGS. 12A and 12B are views showing another structure of a preferable alignment mark for the projection exposure apparatus shown in FIG. 1, and a photoelectric signal to be obtained when the foregoing mark is used.
Figure 12B:
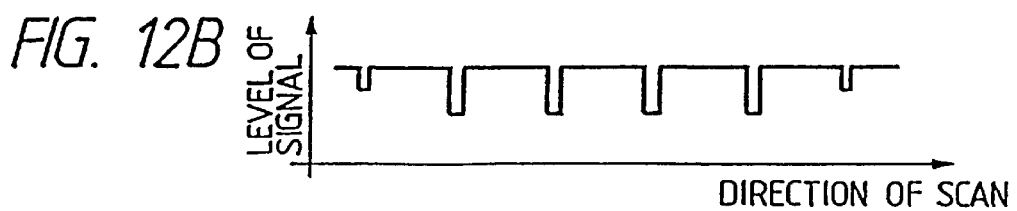

Further, as shown in FIG. 12A, the alignment mark $AL_6$ is a combination of five oblong patterns $AL_{6a}$ to $AL_{6e}$. In other words, the alignment mark $AL_6$ is such that the five oblong patterns $AL_{6a}$ to $AL_{6e}$ are repetitively arranged in the scanning direction (direction Y) under the same condition as the alignment mark $AL_5$ in FIG. 11A. Therefore, when the alignment mark $AL_6$ and the projection image SY' are relatively scanned in the direction Y, the photoelectric signal emitted from the photoelectric detector 20 will become such as shown in FIG. 12B. As clear from FIG. 12B, the signal level at each of the edges of boundary portions of the five oblong patterns $AL_{6a}$ to $AL_{6e}$ is significantly lowered. As a result, compared to the edges at both ends, the signal level is greatly lowered at the edges of the boundary portion between the oblong patterns $AL_{6a}$ and $AL_{6b}$. Thus, in the present embodiment, using the signal waveforms in the vicinity of each boundary portion, the positions of the four edges are detected and the mark position is determined on the basis of these four edge positions. Consequently, compared to the alignment mark $AL_5$ in FIG. 11A, not only the detection accuracy for the mark position is enhanced, but also the measurement reproducibility can be improved.

The description has been made of the alignment marks preferably used for the apparatus shown in FIG. 1 so far, and in FIG. 8A, FIG. 9A, and FIG. 10A, the alignment marks $AL_2$ to $AL_4$ are arranged to be of the cross-type in order to make them applicable to the positional detection in the directions X and Y. However, the configuration of the alignment marks can be arbitrary. It is possible to make it a linear mark as in FIG. 3, for example. Further, it is possible to make the alignment mark $AL_3$ a linear mark and arrange a plurality of such mark at given pitches in the scanning direction so as to use them as a multi-mark. In this case, the arrangement intervals of a plurality of the linear marks should be equal to or more than the detection resolution of the mark detection system. In other words, it is desirable to define them to be equal to or wider than the width of the projection image SY'. In this respect, it is possible to constitute a multi-mark by making the alignment mark $AL_2$ or $AL_4$ a linear mark. Also, in FIG. 11A, whereas one side of the oblong pattern $AL_{5a}$ and one side of the oblong pattern $AL_{5b}$ are arranged on the same straight line, it is possible to arrange them separately in the scanning direction only if its interval is within the range of the detection resolution (that is, the width of the projection image SY') of the mark detection system. In this case, there is no need for the patterns $AL_{5a}$ and $AL_{5b}$ to be arranged with a shift in the direction (X direction) orthogonal to the scanning direction. Both can be arranged in series in the scanning direction.

Figure 13:
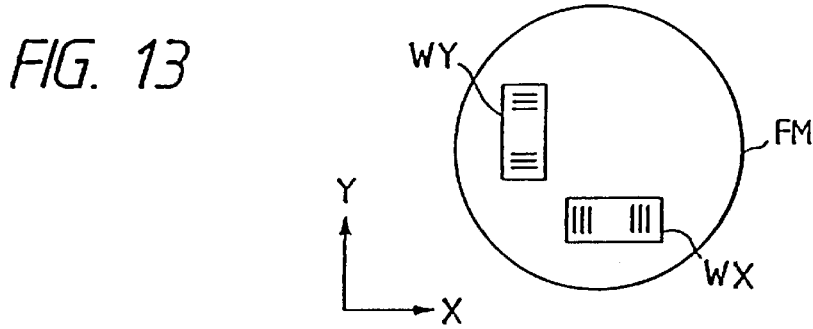
FIG. 13 is a view showing the structure of a fiducial member to be used for a projection exposure apparatus according to a second embodiment of the present invention.
Figure 14:
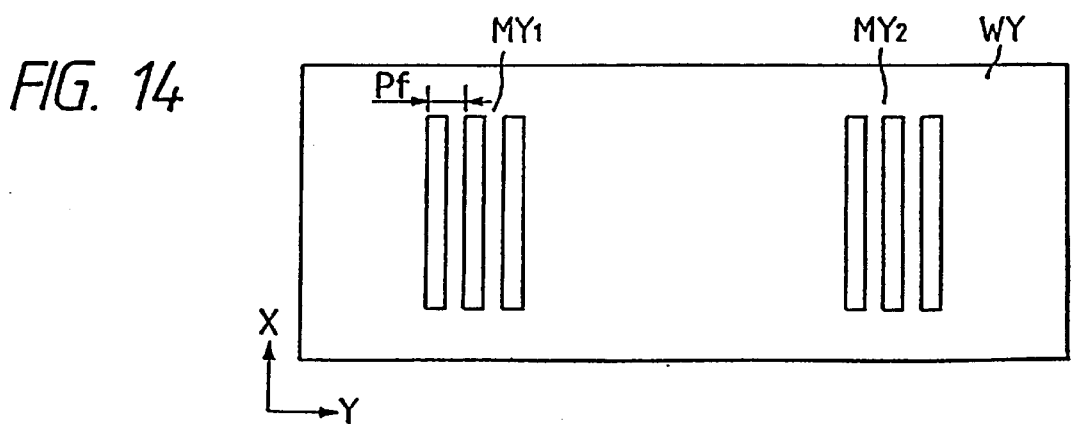
FIG. 14 is a view showing the specific structure of a transparent window shown in FIG. 13.
Figure 15:
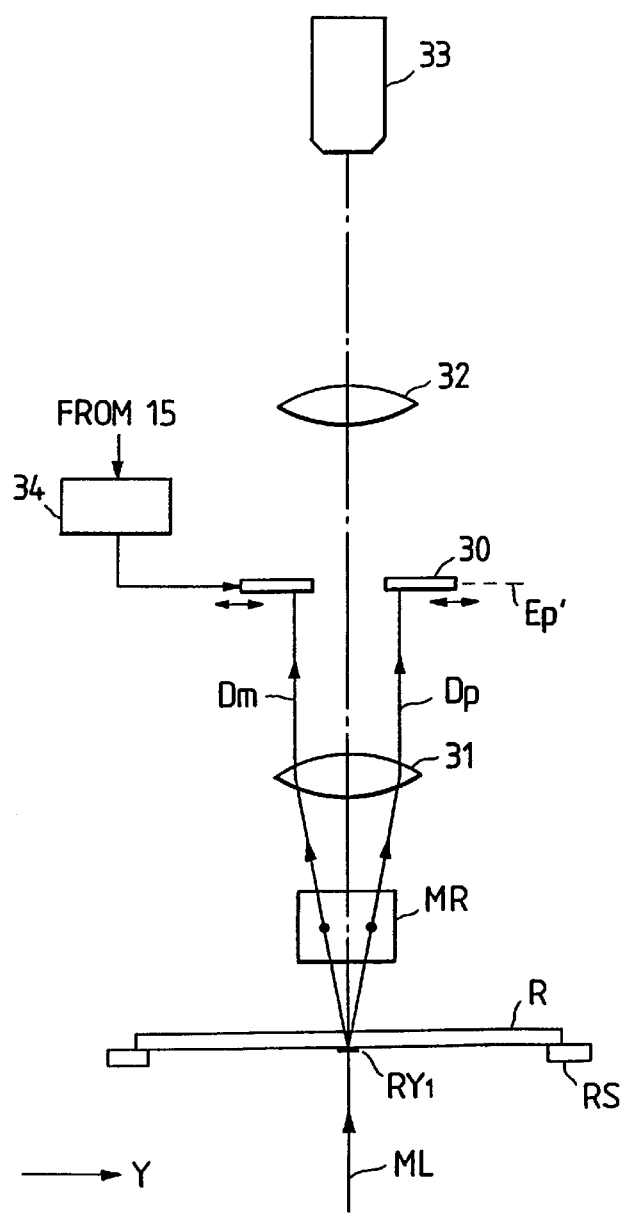
FIG. 15 is a view showing the structure of a mark detection system, particularly that of a light receiving optical system according to the second embodiment of the present invention.

Next, the description will be made of a projection exposure apparatus according to a second embodiment of the present invention. In the present embodiment, the marks on the reticle are detected by use of an image sensor. Here, only what differs from the first embodiment will be described. The differences from the first embodiment are the structures of the fiducial member FM and the mark detection system (light receiving optical system). All the other structures are exactly the same as those of the first embodiment (FIG. 1). FIG. 13 is a view showing the structure of the fiducial member FM used for the present embodiment. FIG. 14 is a view showing the specific structure of the transparent window WY shown in FIG. 13. FIG. 15 is a view showing the mark detection system in the present embodiment, particularly the specific structure of a light receiving optical system.

As shown in FIG. 13, two sets of transparent windows WX and WY are formed on the fiducial member FM. Further, in each of the windows, two sets of diffraction grating marks formed with a light shielding material (chrome or the like) are formed. Here, with reference to FIG. 14, the specific structure of the transparent window WY will be described. In the transparent window WY, two sets of diffraction grating marks $MY_1$ and $MY_2$ are arranged apart at a given interval in the measuring direction (direction Y). The diffraction grating marks $MY_1$ and $MY_2$ are both formed with three bar marks extending in the direction X being arranged at pitches $P_f$ in the direction Y. The pitch $P_f$ is defined to be a sufficiently large value (approximately 4 $\mu$m). In this respect, the transparent windows WX and WY are illuminated from the lower face thereof with the illuminating light ML from the illuminating system (LS, 10 to 12) in the same manner as the first embodiment.

Here, as in the first embodiment, it is assumed that the mark $AL_1$ in FIG. 3 is used as the alignment mark $RY_1$. Further, above the alignment mark $RY_1$, a mirror MR is arranged with an inclination of 45°, and the structure is arranged so that the transmitting light through the reticle R is bent vertically by means of the mirror MR to be guided to the mark detection system. However, in FIG. 15, the mark detection system (light receiving optical systems 30 to 33) is extended above the reticle R in its representation in order to make the description readily understandable.

The light-passing through the transparent window WY reaches the reticle R through the projection optical system PL to cause the image of the transparent window WY to be imaged on its pattern surface. Further, the light passing through the alignment mark $RY_1$ is reflected by the mirror MR and then, guided to the light receiving surface of the image sensor (CCD or the like) 33 by means of a relay lens systems 31 and 32 and a variable aperture diaphragm 30. The variable aperture diaphragm 30 is arranged in a plane EP' conjugate to the pupil surface Ep of the projection optical system PL. Its structure is the same as the variable aperture diaphragm 18 in FIG. 4 (refer to FIG. 16). Therefore, it is possible to arbitrarily change the aperture diameters, aperture positions and the like within the plane Ep' by driving each of the movable blades of the variable aperture diaphragm 30 individually by the driving system 34. Also, the image sensor 33 (light receiving surface) is arranged in a plane conjugate to the pattern surface of the reticle R in relation to the relay lens systems 31 and 32.

Figure 16:
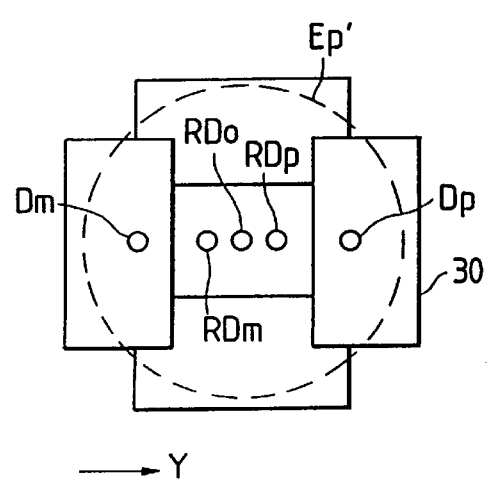
FIG. 16 is a view showing the light distribution in the vicinity of the variable aperture diaphragm shown in FIG. 15.

Next, the description will be made of the reticle alignment operation in brief. Here, given the maximum value of the aperture number of the light receiving optical systems (30 to 33) as $NA_{MAX}$, the alignment mark $RY_1$ is formed at a pitch $P_R$ which will satisfy the relation. $P_R \geq \lambda/NA_{MAX}$. Accordingly, it is arranged that the ± primary rays of diffraction light Dp and Dm from the alignment mark $RY_1$ always pass the pupil conjugate plane EP'. Also, in the present embodiment, two sets of diffraction grating marks $MY_1$ and $MY_2$ are formed in the transparent window WY. As shown in FIG. 16, therefore, in the pupil conjugate plane Ep', the rays of light emitted from the alignment mark $RY_1$, that is, the zeroth light $RD_0$ and the ± primary rays of light RDp and RDm emitted from the diffraction grating marks $MY_1$ and $MY_2$, pass between the ± primary rays of light Dp and Dm.

Consequently, it is necessary for the present embodiment to determine the setup conditions (aperture diameters, aperture positions, etc.) of the variable aperture diaphragm 30 on the basis of the pitch $P_R$ of the alignment mark $RY_1$ and the pitches $P_f$ of the diffraction grating marks $MY_1$ and $MY_2$ so as to cause only the ± primary rays of light Dp and Dm to be shielded. It is assumed that the σ value of the illumination system to illuminate the transparent window WY is set at 0.2. Also, it is assumed that both pitches $P_R$ and $P_f$ are formed in a relation $2P_R = P_f/M$ (M: the magnification of the projection optical system PL), in order to satisfy a relation $P_R < P_f/M$, for example. Therefore, the rays of light from two marks will not be overlapped even partially in the pupil conjugate plane Ep'.

From the above arrangement, it becomes possible for the image sensor to detect not only the diffraction grating marks $MY_1$ and $MY_2$, but also the aforesaid mark $RY_1$ even if the alignment mark $RY_1$ is constituted only with a phase shifter or a semitransparent member. In this case, the alignment mark $RY_1$ is detected by the image sensor as a one dark image.

The main control system 15 determines the setup conditions for the variable aperture diaphragm 30 as described earlier in accordance with information (such as material and pitches of the alignment mark) from a bar code reader 17. Further, in accordance with the conditions thus determined, each of the movable blades of the variable aperture diaphragm 30 is driven by the driving system 34. At this juncture, if the σ value of the illumination system (LS and 10 to 12) is great, the variable aperture diaphragm 21 in FIG. 7 is driven to set the a value at approximately 0.2. Then, the wafer stage WS is shifted to position the transparent window WY with respect to the alignment mark $RY_1$.

Figure 17A:
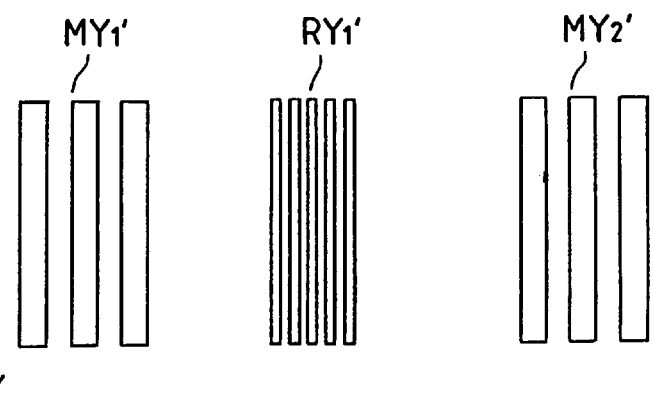
FIGS. 17A and 17B are views showing an example of the mark image detected by the image sensor shown in FIG. 15 and the image signal emitted from the image sensor.

Subsequently, the illuminating light ML is irradiated onto the fiducial member FM to illuminate the alignment mark $RY_1$ with the light transmitted through the transparent window WY. The light which has passed the reticle R is reflected by the mirror MR and guided further to the image sensor 33 through the relay lens systems 31 and 32 and the variable aperture diaphragm 30 to cause the image $RY_1'$ of the alignment mark $RY_1$ and the images $MY_1'$ and $MY_2'$ of the diffraction grating marks $MY_1$ and $MY_2$ to be imaged on the light receiving surface (FIG. 17A). In FIG. 17A, although the five bar marks of the mark image $RY_1'$ are separated, they are observed as one thick mark (dark image) in practice. An image signal (FIG. 17B) is then transmitted from the image sensor 33 to a signal processing circuit 16 where the amounts of positional shift in the direction Y are calculated for the alignment mark $RY_1$ and the diffraction grating marks $MY_1$ and $MY_2$.

The main control system 15 determines the position (coordinate value) of the alignment mark $RY_1$ in the direction Y in accordance with the positional shift amounts and the positional signals from an interferometer 7. Thereafter, each position of the remaining three alignment marks $RY_2$, $RX_1$, and $RX_2$ is obtained by exactly the same operations as above thereby to calculate the shift amounts of the reticle R in the X, Y, and rotational directions with respect to the orthogonal coordinate systems XY on the basis of these coordinate values thus obtained. After that, the reticle stage RS is minutely shifted to make each of the shift amounts zero, hence terminating the reticle alignment.

As described above, in the present embodiment, it is possible to detect the positions of the alignment marks with a desirable accuracy by the mark detection system provided with the image sensor even by the use of the phase shift reticle of a shifter light shielding type or of a half tone type as it is with the alignment marks formed in the same process as the formation of the circuit patterns. In this respect, according to the present embodiment, the two sets of diffraction grating marks $MY_1$ and $MY_2$ are formed on the transparent window WY as shown in FIG. 14, but it is possible to detect the positional shift as described above using two edges extending in the direction X at both ends of the transparent window WY without forming the diffraction grating marks $MY_1$ and $MY_2$.

Figure 17B:
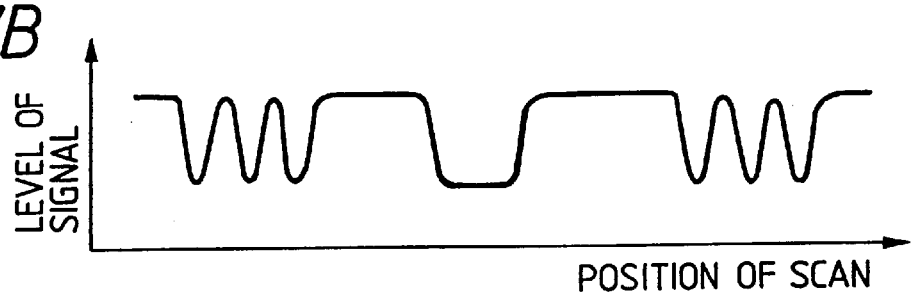
Figure 18A:
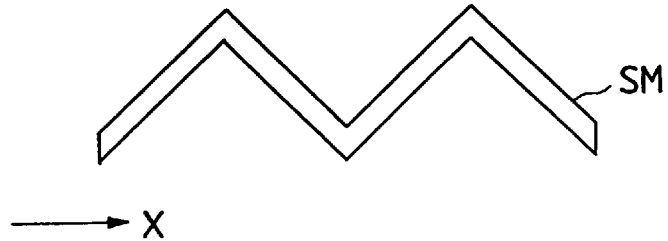
FIGS. 18A and 18B are views showing the preferable mark structure on the fiducial member for the projection exposure apparatus according to the second embodiment, and the structure of the mark to be formed on a reticle when the foregoing mark is used.
Figure 18B:
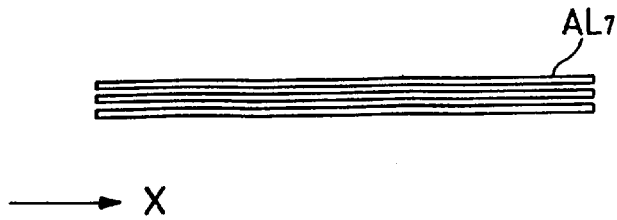

Here, in the present embodiment, if the pitch $P_R$ of the alignment mark $RY_1$ is defined to satisfy the relation $P_R < \lambda/NA$, the ± primary rays of light Dp and Dm from the aforesaid mark $RY_1$ are not allowed to enter the mark detection system (image sensor 33). In other words, even without the provision of the variable aperture diaphragm 30, it is possible to obtain an image signal such as shown in FIG. 17B from the image sensor 33. Also, a slit mark SM having light transmittance such as shown in FIG. 18A can be formed on the fiducial member FM and further, an alignment mark $AL_7$ such as shown in FIG. 18B can be formed as an alignment mark $RY_1$. Then, both images are detected by the image sensor 33 to enable the signal processing circuit 16 to calculate the intervals of the portions where both of them are overlapped in the direction X. Further, the main control system 15 calculates the positional shift amounts for both of them in the direction Y on the basis of the intervals mentioned above. As a result, compared to the second embodiment, the measurement accuracy of the positional shift amounts can be enhanced according to the present embodiment. In this respect, for the principle of a measuring method such as mentioned above, an application has been filed as Ser. No. 801,372 (on Dec. 2, 1991).

Figure 19:
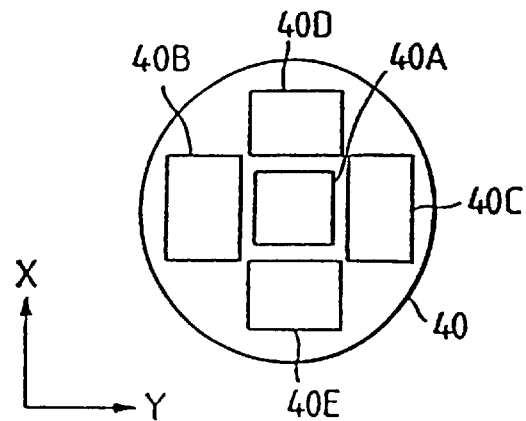
FIG. 19 is a view showing another structure of the photoelectric detector usable for the projection exposure apparatus shown in FIG. 1.
Figure 20:
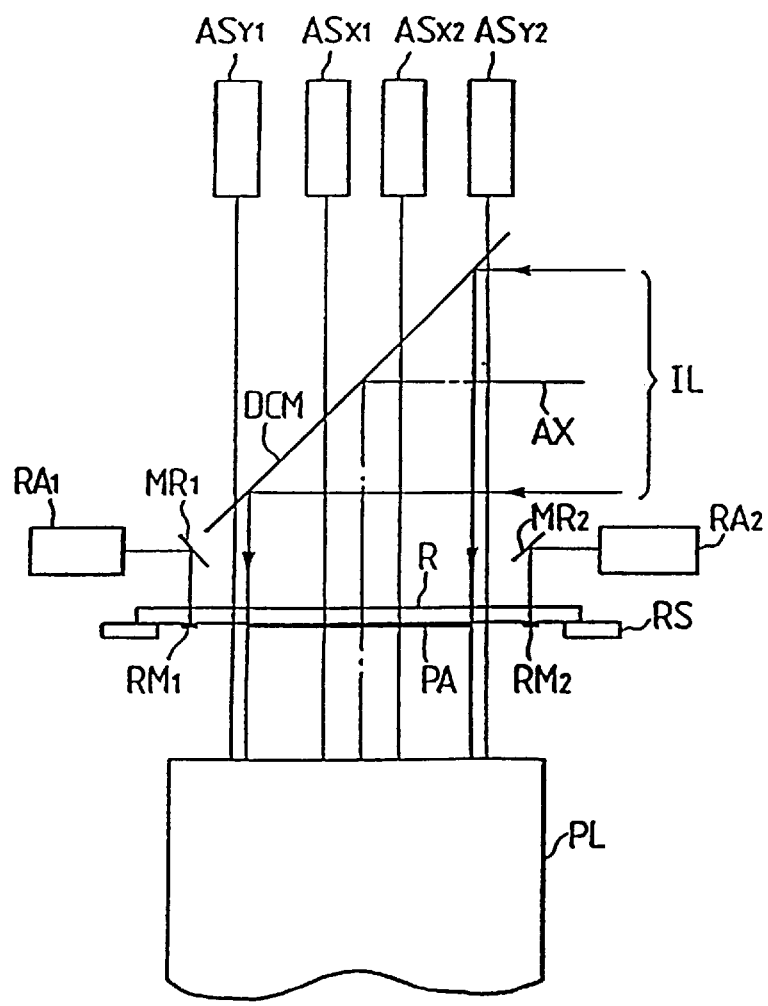
FIG. 20 is a view schematically showing the structure of a conventional projection exposure apparatus.

Also, in the first embodiment, the variable aperture diaphragm 18 is used, but it is possible to detect the alignment mark positions with a desirable accuracy without the provision of the variable aperture diaphragm 18 if, for example, a photoelectric detector 40 provided with a plurality (five in FIG. 19) of light receiving surfaces 40A to 40E is arranged as shown in FIG. 19 instead of the photoelectric detector 20. When the photoelectric detector 40 shown in FIG. 19 is used, the ± primary diffraction rays of light Dp and Dm emitted from the alignment mark. $RY_1$ enter the light receiving surfaces 40B and 40C as clear from FIG. 6A while the light passing through the light transmittable portions other than the mark enters the light receiving surface 40A. In other words, the photoelectric signal output from the light receiving surface 40A will be such as shown in FIG. 3. Here, the light receiving surface to be used is selected in accordance with the alignment mark formation conditions (such as materials and pitches), thus making it possible to use only photoelectric signals from such a light receiving surface. Then, the alignment mark positions can be detected accurately as in the first embodiment. The main control system 15 determines the light receiving surface to be used on the basis of information contained in the bar code pattern BC (pitches, etc.) and then the signal processing circuit 16 detects the alignment mark positions using the photoelectric signals thus determined earlier.

For the above-mentioned first and second embodiments, the description has been made of the case where the present invention is applied to the mark detection system employed for the reticle alignment and the base line measurement, but it is possible to obtain the same effects by applying the present invention to any of the detection systems for detecting marks on a reticle. For example, the present invention can be applied without any problem to an alignment sensor of a TTR (Through The Reticle) type which detects marks on a reticle and marks on a wafer at the same time. Also, it is possible to obtain the same effects by applying the present invention as it is to the detection of the mark images on a reticle using a photoelectric detector arranged on a wafer stage WS as disclosed in U.S. Pat. No. 4,629,313. In this respect, it is desirable to set the illuminating light to irradiate the fiducial member substantially in the same wavelength range as the illuminating light for exposure when any illuminating light is irradiated onto an alignment mark through a projection optical system or light emitted from an alignment mark is received through a projection optical system. In any other cases, there is no problem in using an illuminating light having a different wavelength from the exposure wavelength in the mark detection system.

What is claimed is:

1. A photomask comprising:
    a fiducial mark constituted with a first transmittable portion which is substantially transparent for an illuminating light of a given wavelength, and a second transmittable portion providing a phase difference of substantially (2n+1) π (n: an integer) for the light beam transmitted from said first transmittable portion,
    said first transmittable portion or said second transmittable portion being formed in a width approximately less than the detection resolution of a mark detection system to detect said fiducial mark.

2. A photomask comprising:
    a fiducial mark of a diffraction grating mark type on which there are alternately arranged a first transmittable portion substantially transparent for an illuminating light of a given wavelength, and a second transmittable portion providing a phase difference of substantially (2n+1) π (n: an integer) for the light beam transmitted from said first transmittable portion,
    said first transmittable portion and said second transmittable portion being arranged at pitches enabling the rays of light emitted from said fiducial mark to be diffracted toward outside the incident pupil of a mark detection system.

3. A photomask of claim 2, wherein given the aperture number of said mark detection system as NA and the wavelength of the illuminating light irradiated onto said fiducial mark as λ, the pitch $P_R$ of said fiducial mark satisfies a relation $P_R < \lambda/NA$.

4. A photomask of claim 2, wherein said second transmittable portion has a transmittivity of 1 to 50% for said illuminating light.

5. A projection exposure apparatus comprising:
    an illumination system for irradiating a first illuminating light onto a pattern formed on a mask;
    a projection optical system for projecting an image of the pattern of said mask onto a substrate;
    a mark detection system for irradiating a second illuminating light onto an alignment mark formed on said mask and to receive rays of said second illuminating light emitted from said alignment mark,
    said mark detection system having a photoelectric detector, a light receiving optical system for guiding the rays of light emitted from said alignment mark to said photoelectric detector, and an adjustable stop member arranged at or near a Fourier transform plane for said alignment mark in said light receiving optical system, said stop member being adjustable to variably set at least one of an aperture diameter and an aperture position thereof in accordance with formation conditions of said alignment mark, wherein the aperture diameter of said stop member is so set that when said alignment mark is a diffraction grating mark having a phase member which displaces a phase of said second illuminating light by substantially (2n+1) π (n: an integer), an effective numerical aperture NA of said mark detection system satisfies the following relation:

NA<λ/PR wherein λ is a wavelength of said second illuminating light and $P_R$ is a pitch of said diffraction grating mark.

6. A projection exposure apparatus comprising:
    an illumination system for illuminating a pattern formed on a mask;
    a projection optical system for projecting an image of the pattern of said mask on a substrate;
    said mask being provided with a diffraction grating mark having a phase member which displaces a phase of a transmission light by substantially (2n+1) π (n: an integer); and
    a mark detection system for illuminating said diffraction grating mark with an illumination light and to receive illumination light emitted from said diffraction grating mark, an effective numerical aperture NA of the mark detection system satisfying the following relation:

NA<λ/$P_R$ where λ is a wavelength of the illumination light irradiated on said diffraction grating mark and $P_R$ is a pitch of said diffraction grating mark.

7. An apparatus according to claim 6, wherein said mark detection system has a stop member which prescribes said effective numerical aperture NA which satisfies said relation NA<λ/$P_R$.

8. An exposure apparatus for exposing a substrate with an image of a pattern formed on a phase shift mask, comprising:
    an alignment mark which includes one of a phase shifter member and a semitransparent member on the mask; and a mark detection system for illuminating the alignment mark with detection light, and to receive, through an aperture of a stop member, light emitted at the alignment mark, wherein the stop member has at least one of a size, a shape, and a position of said aperture set in order to block first-order diffraction light emitted at said alignment mark from being received by said mark detection system when said alignment mark is aligned with a predetermined reference for aligning the substrate with the mask;

said alignment mark shifts a phase of transmitted light substantially by $(2n+1) \pi$ (n: an integer), and the stop member sets a diameter of said aperture such that an effective numerical aperture NA of said mark detection system satisfies a relation NA<$\lambda/P_R$, where $\lambda$ is a wavelength of illumination light irradiated on said alignment mark and $P_R$ is a pitch of said alignment mark.

9. An apparatus according to claim 8, wherein said stop member includes a plurality of blades for defining said aperture, said apparatus further comprising a device which drives at least one of said blades in such a manner as to vary at least one of the size, shape, and position of said aperture.

10. An apparatus according to claim 8, further comprising:

a device which inputs information regarding a formation condition of said alignment mark or setup conditions for said stop member, and wherein said stop member has at least one of the size, shape, and position of said aperture set in accordance with the inputted information.

11. An apparatus according to claim 8, wherein said mark detection system includes an illumination device which illuminates a fiducial plate placed on a stage, upon which the substrate is disposed, such that said alignment mark is illuminated with light emitted from a pattern on said fiducial plate.

12. An apparatus according to claim 8, wherein said mark detection sys tem comprises an irradiation system, and a coherence factor $\sigma$ of said irradiation system is adjustable so that zeroth-order light from said irradiation system and first-order diffraction light emitted at said alignment mark do not overlap.

13. An exposure apparatus comprising:

an illumination system for illuminating a pattern formed on a mask so as to expose a substrate with an image of the pattern; and a mark detection system for illuminating an alignment mark formed on the mask and to receive light emitted from the alignment mark, the alignment mark having a phase member which shifts a phase of transmitted light by substantially $(2n+1) \pi$ (n: an integer);

an effective numerical aperture NA of the mark detection system satisfying a relation NA<$\lambda/P_R$, where $\lambda$ is a wavelength of illumination light irradiated on the alignment mark and $P_R$ is a pitch of the alignment mark.

14. An apparatus according to claim 13, wherein said mark detection system includes an aperture stop having an aperture which determines said effective numerical aperture NA.

15. A projection exposure apparatus for projecting a pattern of a phase shift mask to a photosensitive substrate through an optical system comprising:

an alignment mark which includes one of a phase shifter member and a semitransparent member on the mask, said phase shifter member or said semitransparent member shifting a phase of light by $(2n+1) \pi$ (n: an integer) with respect to light transmitted by a light transmissive portion of said mask;

an irradiation system which irradiates detection light to said alignment mark;

a variable aperture diaphragm, which is disposed on or near a Fourier transform plane for said alignment mark, and having an aperture thereof set so as to transmit zeroth-order light from said irradiation system and to block first-order diffraction light emitted at said alignment mark; and a photoelectric converter, disposed on or near said Fourier transform plane, which receives said zeroth-order light in order to align the substrate with the mask.

16. An apparatus according to claim 15, wherein a coherence factor a of said irradiation system is adjustable so that said zeroth-order light and said first-order diffraction light do not overlap.

17. An apparatus according to claim 15, wherein said variable aperture diaphragm is adjustable for changing a dimension or a position of the aperture.

18. An apparatus according to claim 15, further comprising:

an input portion to input information regarding a shape of said alignment mark.

19. An apparatus according to claim 15, further comprising:

a fiducial plate which has a slit; and a stage for supporting said substrate and said fiducial plate;

wherein said irradiation system illuminates said fiducial plate on said stage, and light transmitted through said slit irradiates said alignment mark.

20. A projection exposure apparatus for projecting a pattern of a phase shift mask to a photosensitive substrate through a projection optical system, comprising:

an alignment mark which includes one of a phase shifter member and a semitransparent member on the mask, said phase shifter member or said semitransparent member shifting a phase of light by $(2n+1) \pi$ (n: an integer) with respect to light transmitted by a light transmissive portion of said mask;

an irradiation system which irradiates detection light to said alignment mark;

a variable aperture diaphragm, which is disposed on or near a Fourier transform plane for said alignment mark, and having an aperture thereof set so as to transmit zeroth-order light from said irradiation system and to block first-order diffraction light emitted at said alignment mark; and an image detector, disposed on or near a conjugate plane of said alignment mark, which receives said zeroth-order light in order to align the substrate with the mask.

21. An apparatus according to claim 20, further comprising:

a fiducial plate which has two marks disposed apart from each other and a light transmissive portion; and a stage for supporting said substrate and said fiducial plate;

wherein said irradiation system illuminates said fiducial plate on said stage, and light transmitted through said light transmissive portion of said fiducial plate irradiates said alignment mark, and said image detector receives an image of said two marks through said variable aperture diaphragm.

22. An apparatus according to claim 21, wherein each of said two marks has a diffraction grating with a pitch $P_f$, said alignment mark has a diffraction grating with a pitch $P_R$, and a relation $P_R<P_f/M$ is satisfied, where M is a magnification of said projection optical system.

23. A projection exposure apparatus for projecting a pattern of a phase shift mask to a photosensitive substrate through an optical system, comprising:

an alignment mark which includes one of a phase shifter member and a semitransparent member on the mask, said phase shifter member or said semitransparent member shifting a phase of light by $(2n+1)\pi$ (n: an integer) with respect to light transmitted by a light transmissive portion of said mask;

an irradiation system which irradiates detection light to said alignment mark; and a mark detection system for receiving light emitted at said alignment mark in order to align the substrate with the mask;

wherein said alignment mark has a diffraction grating with a pitch $P_R$, and a relation $P_R<\lambda/NA$ is satisfied, where NA is a numerical aperture of said mark detection system and $\lambda$ is the wavelength of said detection light irradiated on said alignment mark.

24. An apparatus according to claim 22, wherein a coherence factor $\sigma$ of said irradiation system is adjustable so that zeroth-order light from said irradiation system and first-order diffraction light emitted at said alignment mark do not overlap.

25. An apparatus according to claim 24, wherein said coherence factor $\sigma$ is between 0.1 and 0.4.

\* \* \* \* \*